United States Patent
Nagorny et al.

(10) Patent No.: US 10,049,858 B2
(45) Date of Patent: Aug. 14, 2018

(54) SYSTEM AND METHOD FOR PROTECTION OF VACUUM SEALS IN PLASMA PROCESSING SYSTEMS

(71) Applicant: Mattson Technology, Inc., Fremont, CA (US)

(72) Inventors: Vladimir Nagorny, Tracy, CA (US); Steven Parks, Fremont, CA (US); Martin Zucker, Orinda, CA (US)

(73) Assignee: MATTSON TECHNOLOGY, INC., Fremont, CA (US)

( * ) Notice: Subject to any disclaimer, the term of this patent is extended or adjusted under 35 U.S.C. 154(b) by 329 days.

(21) Appl. No.: 14/771,525

(22) PCT Filed: May 9, 2014

(86) PCT No.: PCT/US2014/037415
§ 371 (c)(1),
(2) Date: Aug. 31, 2015

(87) PCT Pub. No.: WO2014/182981
PCT Pub. Date: Nov. 13, 2014

(65) Prior Publication Data
US 2016/0013025 A1    Jan. 14, 2016

Related U.S. Application Data

(60) Provisional application No. 61/821,326, filed on May 9, 2013.

(51) Int. Cl.
*H01J 37/32*    (2006.01)

(52) U.S. Cl.
CPC ...... *H01J 37/32513* (2013.01); *H01J 37/321* (2013.01); *H01J 37/32522* (2013.01); *H01J 2237/166* (2013.01)

(58) Field of Classification Search
CPC .......................... H01J 37/321; H01J 37/32513
(Continued)

(56) References Cited

U.S. PATENT DOCUMENTS 3,685,728 A * 8/1972 Chapou .............. G05D 23/1353
236/12.2
3,741,022 A * 6/1973 Olson ..................... F16H 19/00
324/750.22

(Continued)

FOREIGN PATENT DOCUMENTS

EP        1039502      3/2000
JP        S58-037682   3/1983

(Continued)

OTHER PUBLICATIONS

PCT International Search Report for PCT/US2014/037415, dated Aug. 21, 2014—12 pages.

*Primary Examiner* — Scott W Dodds
(74) *Attorney, Agent, or Firm* — Dority & Manning, P.A.

(57) ABSTRACT

Systems and methods for protecting vacuum seals in a plasma processing system are provided. The processing system can include a vacuum chamber defining a sidewall and an inductive coil wrapped around at least a portion of the sidewall. A vacuum seal can be positioned between the sidewall of the vacuum chamber and a heat sink. A thermally conductive bridge can be coupled between the sidewall and heat sink. Further, the thermally conductive bridge can be positioned relative to the vacuum seal such that the thermally conductive bridge redirects a conductive heat path from the sidewall or any heat source to the heat sink so that the heat path bypasses the vacuum seal.

17 Claims, 7 Drawing Sheets

(58) Field of Classification Search
USPC .................................................. 118/723 VE
See application file for complete search history.

(56) References Cited

U.S. PATENT DOCUMENTS

| | | | | |
|---|---|---|---|---|
| 4,239,091 A | * | 12/1980 | Negrao | F01N 1/24 |
| | | | | 181/243 |
| 5,207,573 A | | 5/1993 | Miyagi et al. | |
| 5,964,468 A | * | 10/1999 | Chester | F16J 15/125 |
| | | | | 277/610 |
| 6,163,007 A | * | 12/2000 | Tanaka | H01J 37/32192 |
| | | | | 219/121.48 |
| 6,308,654 B1 | * | 10/2001 | Schneider | H01J 37/321 |
| 2005/0000432 A1 | | 1/2005 | Keller et al. | |
| 2007/0012251 A1 | | 1/2007 | Zucker et al. | |
| 2012/0298039 A1 | | 11/2012 | Peuse et al. | |

FOREIGN PATENT DOCUMENTS

| | | |
|---|---|---|
| JP | 2002164685 | 6/2002 |
| JP | 2001217097 | 8/2010 |
| JP | 201023894 | 10/2010 |
| TW | 201203349 | 8/2011 |

\* cited by examiner

SYSTEM AND METHOD FOR PROTECTION OF VACUUM SEALS IN PLASMA PROCESSING SYSTEMS

FIELD OF THE INVENTION

The present disclosure relates generally to plasma processing and, more particularly, to systems and methods for protecting vacuum seals in plasma processing systems.

BACKGROUND OF THE INVENTION

Plasma processing is widely used in the semiconductor industry for deposition, etching, resist removal, and related processing of semiconductor wafers and other substrates. Inductive plasma sources are often used for plasma processing to produce high density plasma and reactive species for processing wafers. For instance, inductive plasma sources can easily produce high density plasma using standard 13.56 MHz and lower frequency power generators.

A common element of any low pressure or vacuum plasma processing system is a vacuum seal that separates a low pressure plasma volume from the surrounding atmosphere. The integrity of the vacuum seal is extremely important for the plasma generation system as any gas leaks through the vacuum seal can change the chemical composition of the processing plasma. This can affect the process results or can even destroy the plasma.

Many plasma processing systems have multiple vacuum seals, some of which are in contact with very hot surfaces resulting from the plasma heat. This can lead to a short lifetime of the vacuum seals. While the cost of the vacuum seal itself is relatively high, the main cost of the failure of a vacuum seal is associated with process interruptions necessary to repair or replace the vacuum seal, which lowers yield. To avoid processing downtime, the lifetime of the vacuum seal should be longer than the period between scheduled plasma processing tool maintenance.

Vacuum seal failure can happen in many plasma sources independent of the specific mechanism of plasma generation. The power of the plasma source and the process time at which the vacuum seal fails can depend on the type of source, the material of the sidewalls (e.g. quartz) and other details. However, at some power a heat load from plasma for any kind of source becomes very high which can result in vacuum seal failure. The plasma-processing tool can be designed such that the vacuum seal is located further away from the plasma, thus reducing the heat load. This technique, however, only partially addresses the problem because the sidewall adjacent to the seal area will slowly warm up due to heat conductivity. In addition, this technique is difficult to apply to existing plasma sources because any significant change in the design will require requalification of the tool.

Thus, a need exists for a system and method to protect vacuum seals in plasma processing equipment such that the life of the vacuum seal is extended. A system and method that can be retrofitted or applied to existing plasma source designs would be particularly useful.

BRIEF DESCRIPTION OF THE INVENTION

Aspects and advantages of the invention will be set forth in part in the following description, or may be obvious from the description, or may be learned through practice of the invention.

One exemplary aspect of the present disclosure is directed to a plasma processing system. The plasma processing system includes a vacuum chamber having a sidewall and an inductive coil wrapped around at least a portion of the sidewall. Further, the system includes at least one vacuum seal coupled between the sidewall and a heat sink, such as a top plate of a plasma processing chamber or a top cap of the vacuum chamber. A thermally conductive bridge is coupled between the sidewall and the top plate and is located between the inductive coil and the vacuum seal such that the thermally conductive bridge redirects a heat path from the heat source to the top plate so that the heat path bypasses the vacuum seal.

Another exemplary aspect of the present disclosure is directed to a method of protecting a vacuum seal from overheating in a plasma processing system. The method includes separating the vacuum seal area from the heat source with a highly thermally conductive bridge such that the bridge redirects a conductive heat path from the heat source to a heat sink such that the heat path bypasses the vacuum seal.

Other exemplary aspects of the present disclosure are directed to processes, methods, systems and devices for protecting vacuum seals in plasma processing systems.

These and other features, aspects and advantages of the present invention will become better understood with reference to the following description and appended claims. The accompanying drawings, which are incorporated in and constitute a part of this specification, illustrate embodiments of the invention and, together with the description, serve to explain the principles of the invention.

BRIEF DESCRIPTION OF THE DRAWINGS

A full and enabling disclosure, including the best mode, to one of ordinary skill in the art, is set forth more particularly in the remainder of the specification, including reference to the accompanying figures, in which.

DETAILED DESCRIPTION OF THE INVENTION

Figure 1:
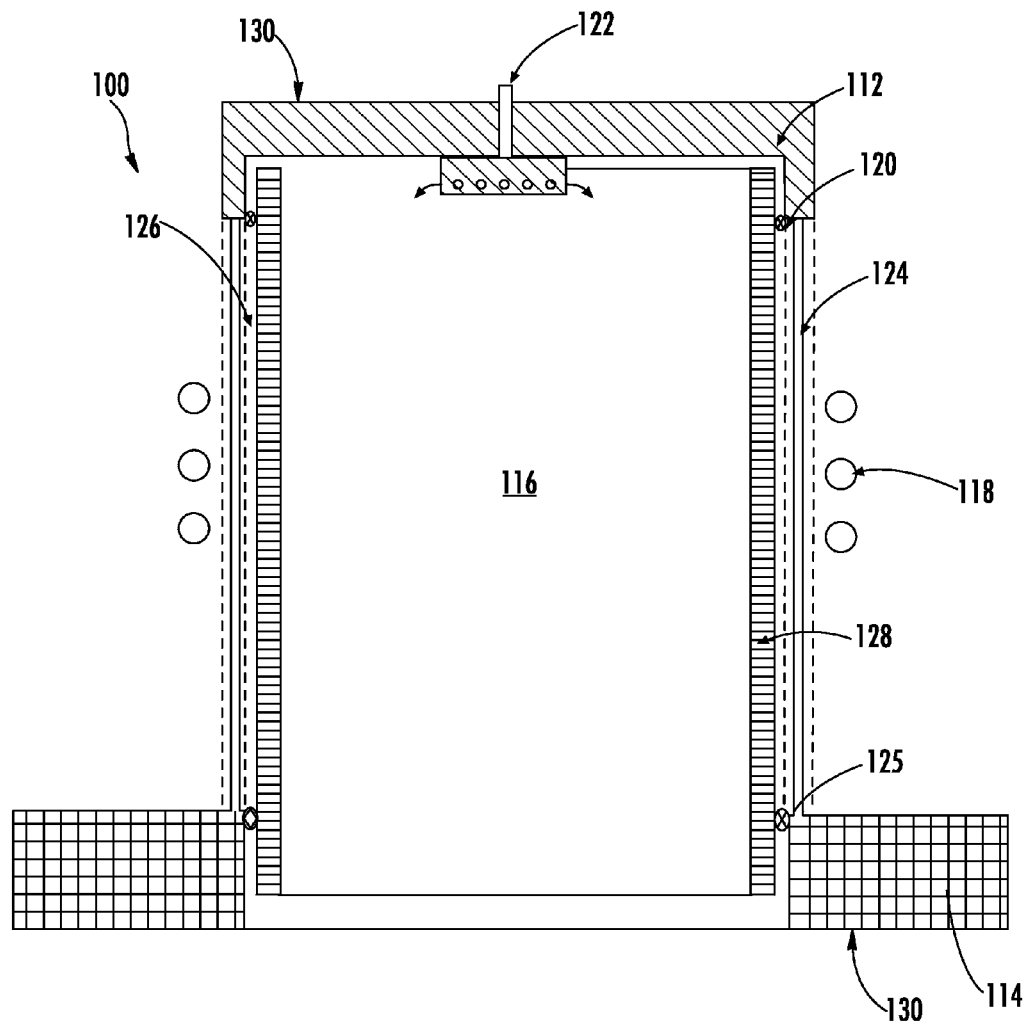
FIG. 1 depicts an exemplary plasma processing apparatus.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment can be used with another embodiment to yield a still further embodiment. Thus, it is intended that the present invention covers such modifications and variations as come within the scope of the appended claims and their equivalents.

Generally, the present disclosure is directed to systems and methods for protecting a vacuum seal used in a plasma processing apparatus. The vacuum seal can be disposed between a sidewall of a vacuum chamber and a heat sink. The heat sink can be part of the vacuum chamber itself, such as a top cap of the vacuum chamber or a top plate of a plasma processing chamber. A thermally conductive bridge can be provided between the sidewall and the heat sink. The thermally conductive bridge can be formed from a metal or other material having a high thermal conductivity (e.g. graphite foam). Due to the positioning of and the high thermal conductivity of the thermally conductive bridge, a conductive heat path that would typically flow through the vacuum seal from the sidewall to the heat sink is redirected such that the heat path bypasses the vacuum seal. More particularly, the thermally conductive bridge contacts both the heat sink and the heated area (i.e. the sidewall of the vacuum chamber) and is placed in a conductive heat path in close proximity to the vacuum seal to provide a shortcut between the heated area and the heat sink.

The thermally conductive bridge protects the vacuum seal from the high temperatures and prolonged exposure to heat generated by the plasma processing system. Further, the thermally conductive bridge can be flexible and elastic so as to provide good contact between the bridge and surrounding contact surfaces. As used herein, the term "flexible" means capable of being bent or flexed. As used herein, the term "elastic" means a material behaves like rubber that is, the material, when compressed in one direction, will expand in the transverse direction (a poisson ratio greater than zero, preferably close to 0.5) and will return to nearly its original shape (e.g. within 90% of its original shape in any dimension) after being stretched, bent, expanded, contracted, or distorted in at least one direction.

The thermally conductive bridge according to aspects of the present disclosure is an economical feature that can be easily incorporated into existing plasma processing systems having varying configurations without requiring substantial redesign. In this manner, the subject matter of the present disclosure provides an effective tool for extending the life of vacuum seals in a plasma processing apparatus.

Referring now to the figures, exemplary embodiments of the present disclosure will now be discussed in detail. FIG. 1 illustrates an exemplary plasma processing system 100. As illustrated, the system 100 includes a vertical cylindrical vacuum chamber 116 defining a sidewall 128. The bottom of the sidewall 128 is connected to a top plate 114 of a processing chamber (not shown) of the plasma processing system 100. The top of the sidewall 128 may be connected to a top cap 112 of the vacuum chamber 116. A radio frequency (RF) inductive coil 118 may be located about the sidewall 128 (or tube) of the vacuum chamber 116. For example, as illustrated, the inductive coil 118 includes three turns about the sidewall 128. In further embodiments, the inductive coil 118 can include more or less than three turns about the sidewall 128.

The sidewall 128 can include any material (e.g. a dielectric material) capable of tolerating a wide temperature gradient and/or high temperatures. For example, the sidewall 128 can include a quartz material. In another embodiment, the vacuum chamber 116 can have a plurality of sidewalls 128 having a non-cylindrical shape, such as a rectangular shape.

A vacuum is enabled in the vacuum chamber 116 by one or more vacuum seals 120, 125 located between the top plate 114 and the sidewall 128 and/or the top cap 112 and the sidewall 128. Further, the vacuum seals 120, 125 may be coupled between the sidewall 128 and a heat sink 130. In various embodiments, the heat sink 130 may be the top plate 114 of the processing chamber, the top cap 112 of the vacuum chamber and/or a Faraday shield 124. For example, as illustrated, a first vacuum seal 120 is provided between the top cap 112 and the sidewall 128 and a second vacuum seal 125 is provided between the top plate 114 and the sidewall 128. The vacuum seals 120, 125 can be any appropriate seal to provide a proper vacuum. For example, in one embodiment, the vacuum seals 120, 125 can be an O-ring type seal.

The top cap 112 is supported by a Faraday shield 124 between the inductive coil 118 and the sidewall 128 or by independent supports 126 (as indicated by the dotted lines). As such, the vacuum seals 120, 125 can provide support for the sidewall 128, as there is limited to no down-force acting on the sidewall 128. For example, as illustrated, the sidewall 128 "floats" on the vacuum seals 120, 125 and does not directly contact to the top cap 112 or the top plate 114. Such limited contact reduces potential particles or debris from being generated in the vacuum chamber 116, but at the same time increases probability of overheating both seals when high power is used.

During operation of the plasma processing system 100, gas enters the vacuum chamber 116 through a gas inlet 122. The gas inlet 122 is typically located on the top of the vacuum chamber 116 such that gas enters the vacuum chamber 116 through the top cap 112. The inductive coil 118 is then energized and plasma is generated within the vacuum chamber 116. As power is increased in the vacuum chamber 116, additional heat is deposited on the sidewall 128. For example, typical heat loads on the sidewall 128 may exceed 3 to 5 W/cm$^2$. Further, typical temperatures of the sidewall 128 may reach or exceed 400 to 500° C. While the sidewall may easily survive these high temperatures, as long as mechanical stresses caused by the temperature variations and pressure do not exceed critical values, such high temperatures can cause disastrous failures in vacuum seals.

Cooling of the sidewall 128 is typically provided by air flow and radiation, both of which are efficient when the temperatures in the system 100 are high. The heat sink 130 typically includes water-cooling to help cool the top cap 112, top cap support 124, and the top vacuum seal 120. More specifically, the heat sink 130 can include water-cooling channels. As mentioned, the heat sink 130 can be the top cap 112, the Faraday shield 124 and/or the top plate 114. While the temperature of cooled top cap and top plate are low, the sidewall 128 temperature in the places of contact with the vacuum seal may exceed critical values for the vacuum seals 120, 125, which can cause the vacuum seals 120, 125 to fail.

Figure 2:
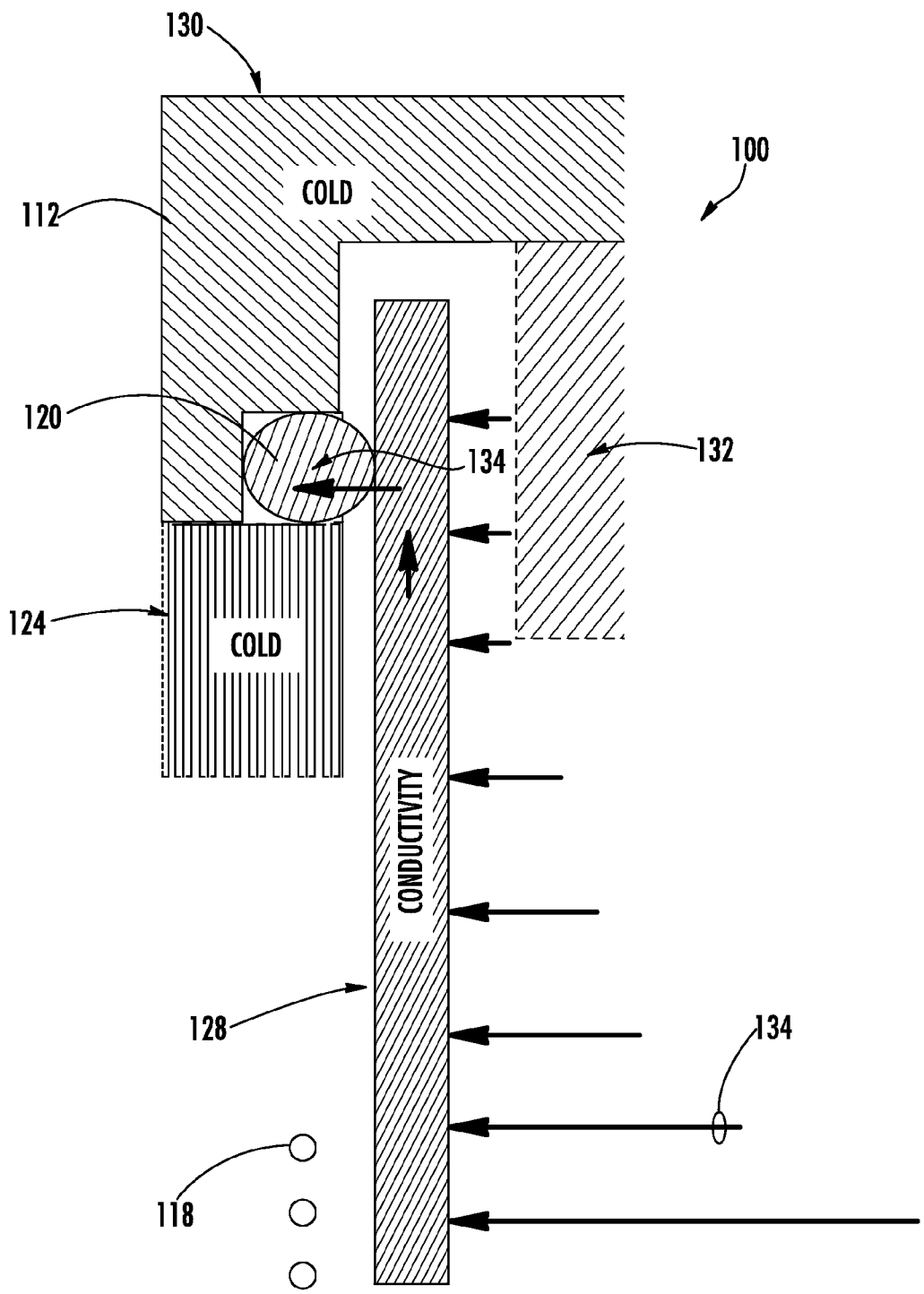
FIG. 2 depicts a detailed view of an exemplary plasma processing apparatus.

FIG. 2 depicts an exemplary conductive heat path 134 through a vacuum seal 120. The heat flux to the sidewall is typically stronger (as indicated by the longer arrows) near the inductive coil 118 and is conducted along the sidewall 128 and through the vacuum seal 120 to the heat sink 130 (via cap 112 in this example). As a result, the vacuum seal 120 can be exposed to the high temperatures experienced by the sidewall 128. The same situation applies to vacuum seal 125 at the opposite end (not shown in this detail view).

The vacuum seal 120 can be located in an area where the heat load from the vacuum chamber 116 is significantly reduced, as shown in FIG. 2, where the vacuum seal 120 is located a distance away from the inductive coil 118. The heat and UV load to the vacuum seal 120 can be further reduced by expanding the top cap 112 and/or including a plasma screen 132. For example, a plasma screen 132 may be located proximate the vacuum seal 120 and reduce direct heat from the vacuum chamber 116 in the seal area. The primary source of heat to the vacuum seal 120 is conductive heat flow from hotter areas of the sidewall 128, as indicated by the conductive heat path 134.

Figure 3:
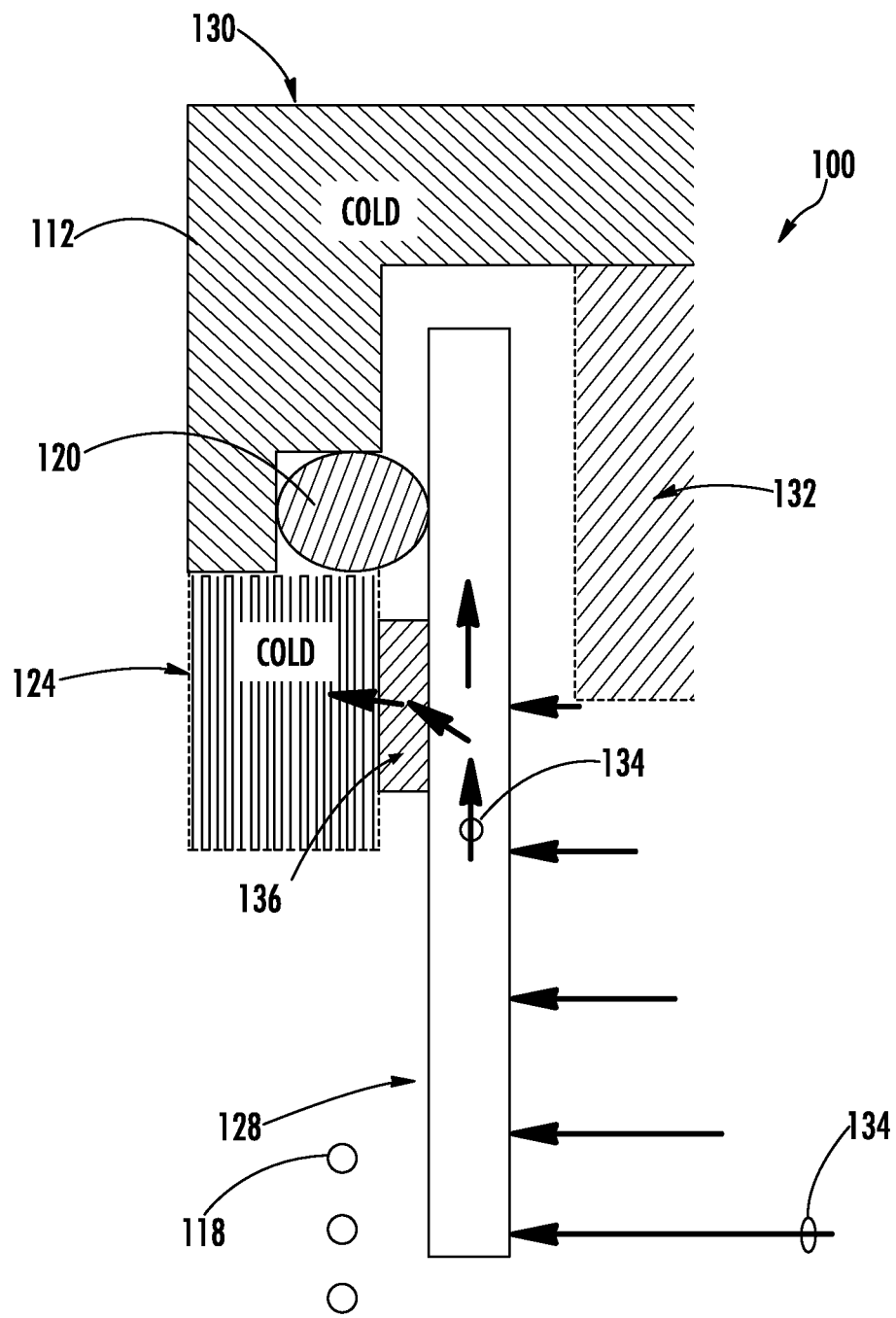
FIG. 3 depicts a detailed view of a plasma processing apparatus having a thermally conductive bridge according to an exemplary embodiment of the present disclosure.

To address this concern, exemplary aspects of the present disclosure are directed to including a thermally conductive bridge to redirect the heat path such that it bypasses the vacuum seal. FIG. 3 illustrates a plasma processing system 100 including an exemplary thermally conductive bridge 136 between the heat sink 130 and the sidewall 128 so as to further protect the vacuum seal 120. The thermally conductive bridge 136 can be coupled between the heat source and the heat sink 130 and positioned relative to the vacuum seal 120 such that it redirects a conductive heat path 134 from the heat source (i.e. the vacuum chamber) to the heat sink 130. For example, the temperature of the thermally conductive bridge 136 and the heat source contacting the thermally conductive bridge 136 can be substantially equal to the temperature of the heat sink 130. Further, the thermally conductive bridge 136 can be located between the inductive coil 118 and the vacuum seal 120. As a result, at least a portion of the heat path 134 is redirected by the thermally conductive bridge 136 to the heat sink 130, thereby reducing the heat flux to the vacuum seal 120 and protecting the integrity of the vacuum seal 120. In further embodiments, the thermally conductive bridge 136 can be positioned so that the heat path 134 bypasses a portion of the sidewall 128 abutting the vacuum seal 120.

The thermally conductive bridge 136 can be made of a highly conductive material, such as metal or graphite foam. Such a highly conductive material provides appropriate heat transfer from the heat source to the heat sink 130. Further, the thermally conductive bridge 136 can be designed having both flexible and elastic properties. Flexibility will allow conformance of the bridge to the shape of the vessel, vacuum seal, or channel for the bridge and elasticity will provide a good contact to related surfaces by simple compression of the bridge between these surfaces without danger of damaging any of them. Accordingly, the thermally conductive bridge 136, like the vacuum seals 120, are capable of maintaining sufficient contact with surrounding surfaces and do not generate mechanical stresses. In one particular implementation, the thermally conductive bridge 136 can include a heat conducting component and a flexible component coupled to the heat conducting component.

Figure 4:
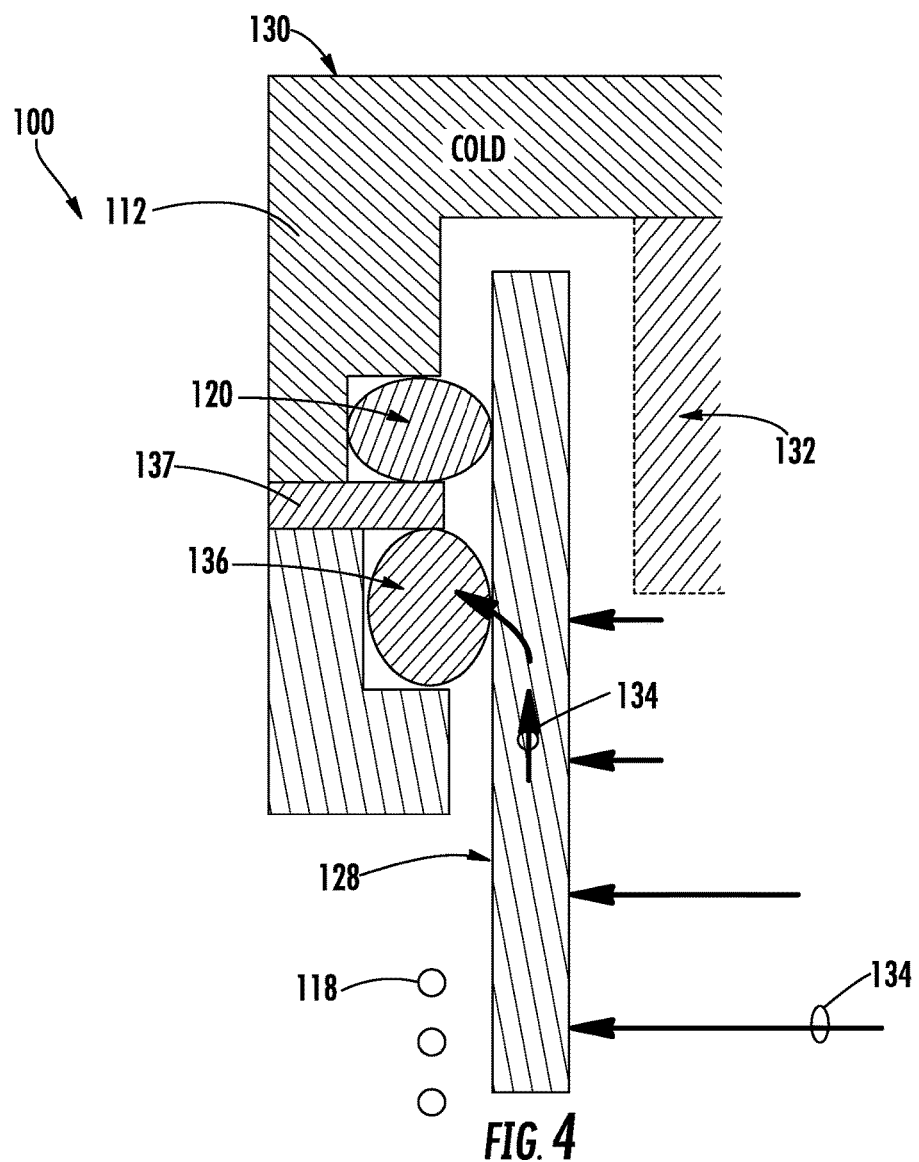
FIG. 4 depicts a detailed view of a plasma processing apparatus having a thermally conductive bridge according to an exemplary embodiment of the present disclosure.

FIG. 4 illustrates the plasma processing system 100 including an exemplary thermally conductive bridge 136 between the heat sink 130 and the sidewall 128. The thermally conductive bridge 136 is provided so as to redirect the heat path 134 from the sidewall 128 to the heat sink 130, such that the heat path 134 bypasses the vacuum seal 120. Further, a spacer 137 is provided between the vacuum seal 120 and the thermally conductive bridge 136.

Figure 5:
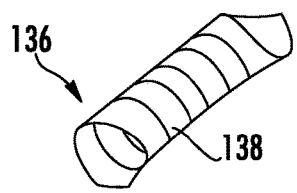
FIG. 5 depicts a thermally conductive bridge according to an exemplary embodiment of the present disclosure.
Figure 6:
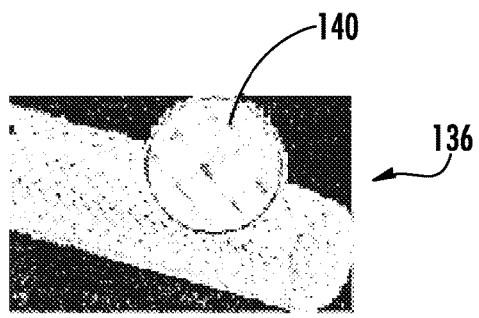
FIG. 6 depicts a thermally conductive bridge according to an exemplary embodiment of the present disclosure.

FIGS. 5 and 6 illustrate exemplary embodiments for the thermally conductive bridge 136 that can be employed in the embodiments described herein. For example, referring to FIG. 5, a thermally conductive bridge 136 having a spiral gasket configuration 138 is illustrated. The spiral gasket 138 can be made of various highly conductive materials, including but not limited to various metals. The flexible spiral gasket 138 can conform to any shape of the surface and can be made elastic to provide sufficient contact between all contacting surfaces. Examples of the spirals are SPIRA-Shield, Flexi-Shield gaskets for RF shielding from Spira™.

Referring now to FIG. 6, a thermally conductive bridge 136 including a metal sleeve 140, is illustrated. The metal sleeve has natural flexibility, but lacks elasticity, so it can be used with elastic filler, like silicone, rubber, etc. (such as an O-ring-type). The metal sleeve 140 provides the appropriate conductivity to redirect the heat path 134, whereas the filler provides sufficient elasticity for making good contacts between the bridge and surfaces.

The embodiments of FIGS. 5 and 6 offer the appropriate conductivity and the necessary elasticity and flexibility to maintain sufficient contact with the heat source and the heat sink 130. For example, in the case of the metal spiral gasket 138 of FIG. 5, the elasticity is provided by the helical shape of the gasket. In the metal sleeve 140 of FIG. 6, the elasticity is provided by the internal filler. The flexibility and elasticity of the thermally conductive bridge provides improved contact between neighboring surfaces and is not sensitive to discrepancies between the surfaces of the sidewall 128 and the heat sink 130. For example, slight ellipticity of the heat source and a circular channel in the heat sink 130 will result in a slightly different cross-section of the thermally conductive bridge 136, which is capable of adjusting to such discrepancies. Using a flexible and elastic conductive bridge can eliminate the need to machine the contact area so that all components have sufficient contacting surfaces.

Figure 7:
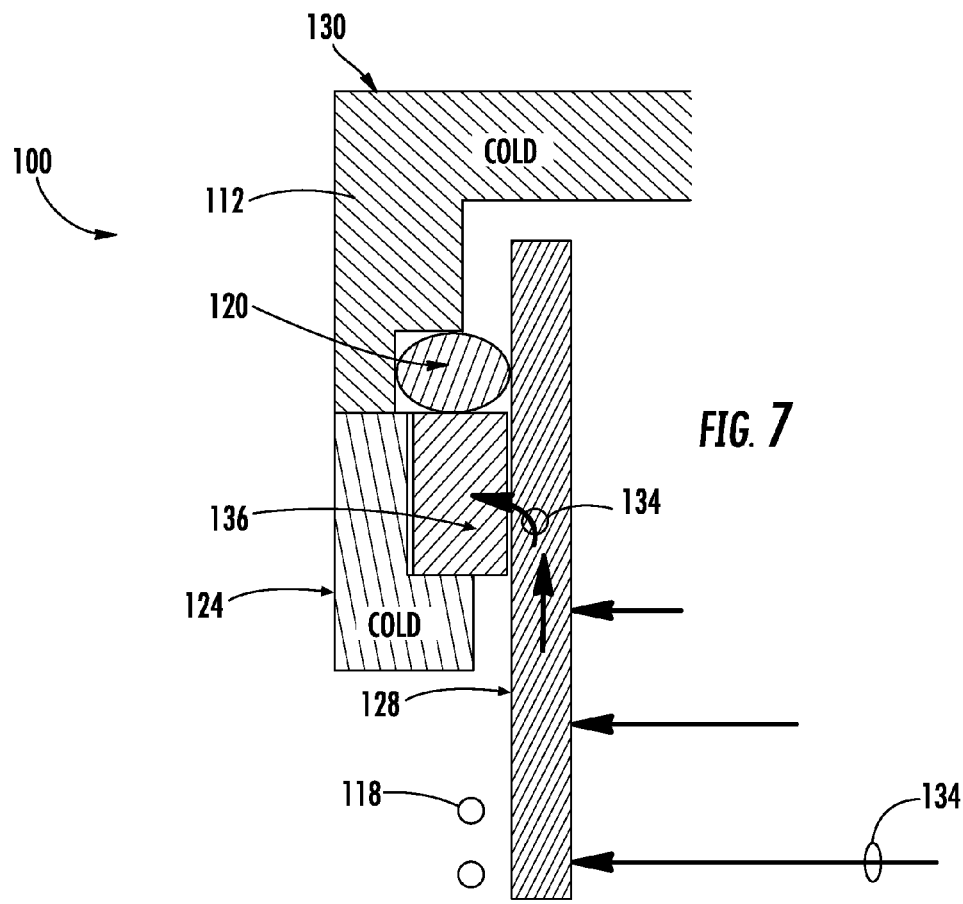
FIG. 7 depicts a detailed view of a plasma processing apparatus having a thermally conductive bridge according to an exemplary embodiment of the present disclosure.
Figure 8:
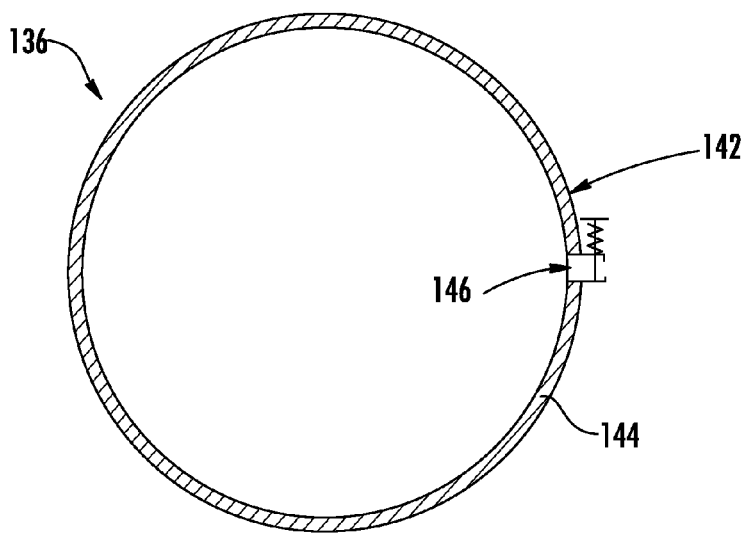
FIG. 8 depicts a thermally conductive bridge according to an exemplary embodiment of the present disclosure.

Referring to FIGS. 7 and 8 another exemplary thermally conductive bridge according to an exemplary embodiment of the present disclosure will now be set forth. The plasma processing system 100 includes the thermally conductive bridge 136 provided between the sidewall 128 and the top cap 112. As shown in FIG. 8, the thermally conductive bridge 136 includes a spring-loaded C-clamp configuration 142. The spring-loaded C-clamp configuration 142 includes a C-shaped clamp 144 compressed by a spring 146. The spring 146 compressing the clamp 144 provides contact between the clamp 144 and the sidewall 128. While this bridge itself here does not have the transverse elasticity required for the contact between the bridge 136 and the second (cold) surface 128, this is provided by the seal 120 itself. The pressure from the vacuum seal 120 provides sufficient force to make a good contact between the clamp 144 and the heat sink 130. Such a configuration provides a large area of contact between the clamp 144 and the sidewall 128 (i.e. the most critical point).

Figure 9:
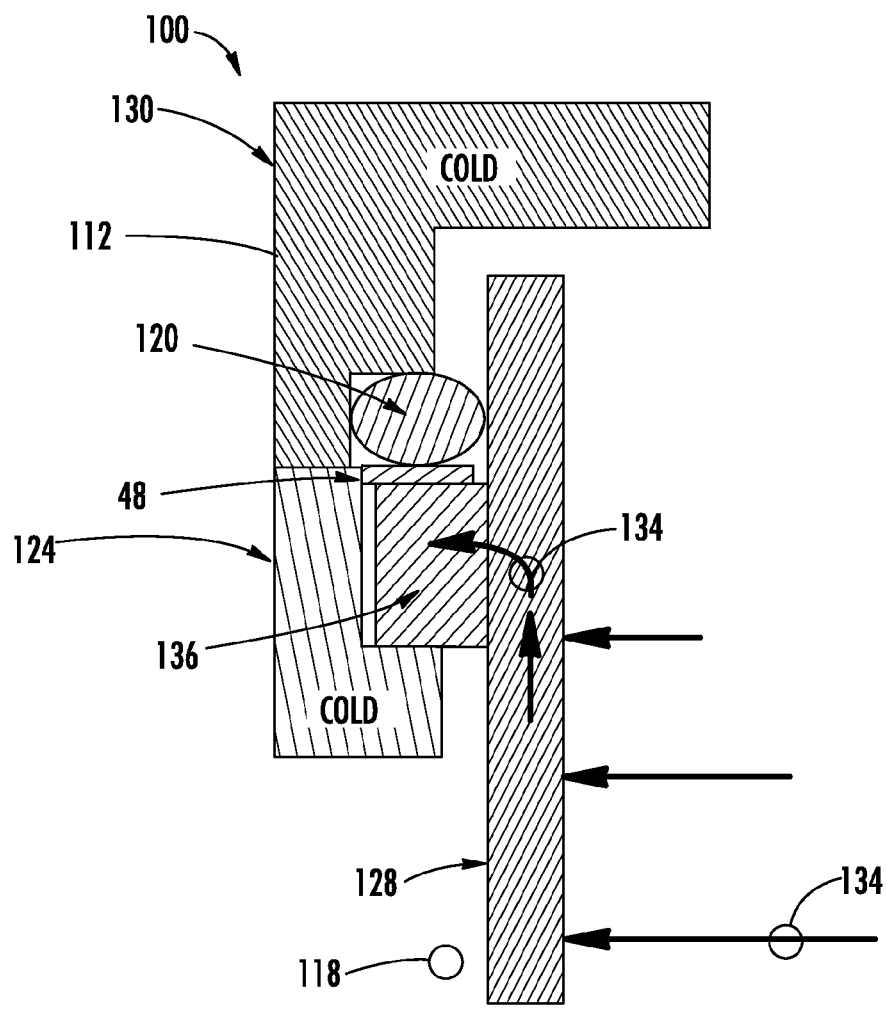
FIG. 9 depicts detailed view of a plasma processing apparatus having a thermally conductive bridge according to an exemplary embodiment of the present disclosure.
Figure 10:
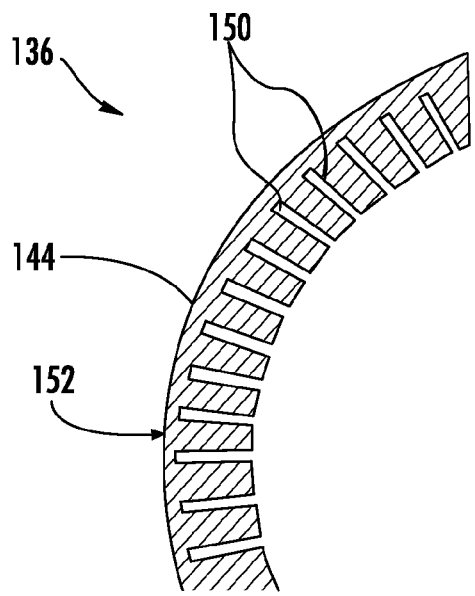
FIG. 10 depicts a thermally conductive bridge according to an exemplary embodiment of the present disclosure.

FIGS. 9 and 10 depict a plasma processing system 100 including a thermally conductive bridge 136 according to another exemplary embodiment of the present disclosure. The thermally conductive bridge 136 has a timing-belt configuration 152 as shown in the sectional top view of FIG. 10. More specifically, the thermally conductive bridge 136 includes a spring-loaded C-clamp (similar to FIGS. 7 and 8) having a plurality of cuts 150. Such cuts 150 increase flexibility of the C-clamp 144, allowing the clamp 144 to adjust to various discrepancies in the heat source (or sidewall 128). In particular implementations, as shown in FIG. 9, the thermally conductive bridge 136 can be separated from the vacuum seal 120 (which provides elasticity to the contact) by a washer 148, to avoid contact of the vacuum seal with the irregular surface of the bridge, which may mechanically damage the seal.

Figure 11:
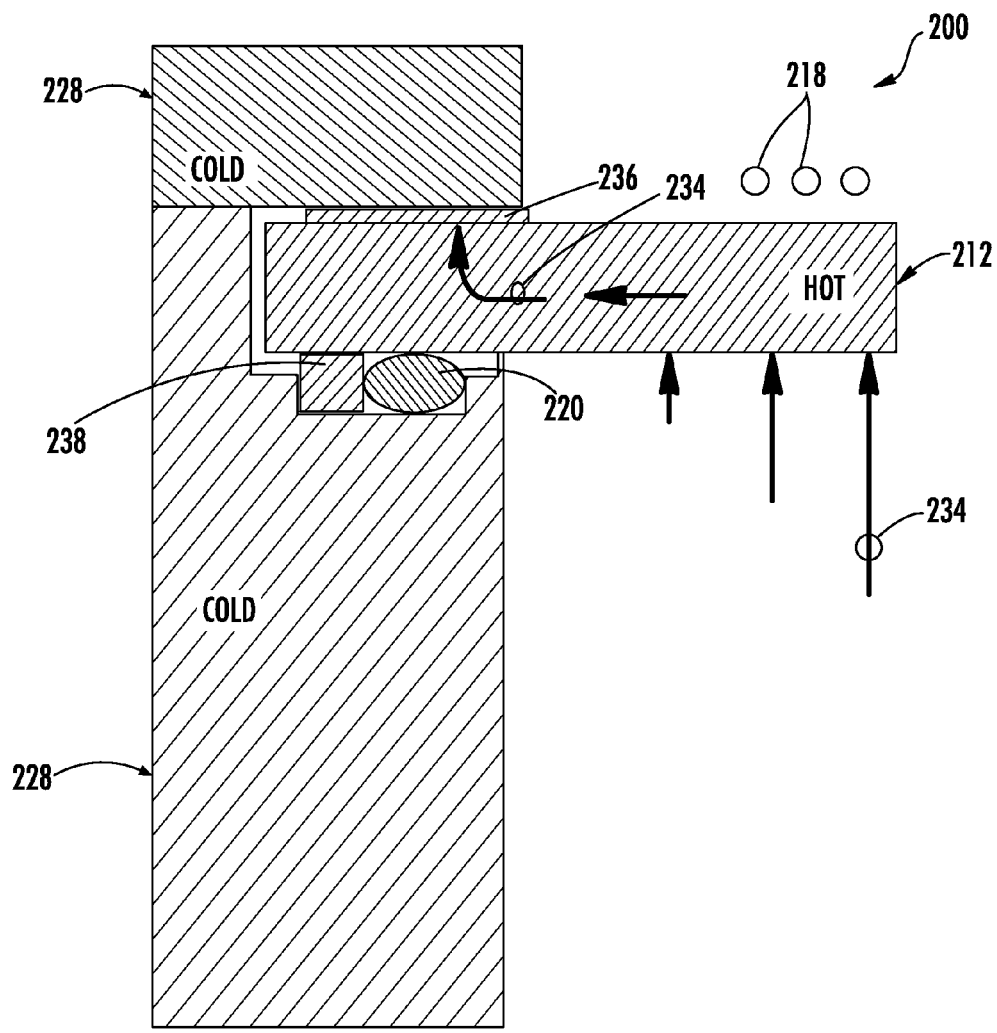
FIG. 11 depicts a detailed view of a horizontal plasma processing apparatus having a thermally conductive bridge according to an exemplary embodiment of the present disclosure.

Referring now to FIG. 11, a plasma processing system 200 having a plasma processing chamber with flat hot top plate is illustrated. The system 200 includes a chamber having a chamber wall 228, a ceiling 212 coupled to the chamber wall 228 via a vacuum seal 220, and an inductive coil 218 adjacent to at least a portion of the ceiling 212. In one embodiment, the ceiling 212 can include a dielectric material such as a quartz material. A thermally conductive bridge 236 is provided between the chamber wall 228 and the ceiling 212. The thermally conductive bridge 236 redirects a heat path 234 from a portion of the ceiling 212 adjacent to the inductive coil 218 to the chamber wall 228 so that the heat path 234 bypasses the vacuum seal 220. A second thermally conductive element 238 can also be coupled between an opposite side of the chamber wall 228 and the ceiling 212 near the vacuum seal 220. This second thermally conductive element 238 can be included to provide auxiliary cooling in the vicinity of the vacuum seal 220 (i.e. there is no longer a heat path 234 to redirect).

The thermally conductive bridge described herein may be constructed using any suitable means. For example, the thermally conductive bridge can be made of metal, graphite foam, or any other material having a high thermal conductivity. Further, the thermally conductive bridge can have a contact length so as to redirect a required portion of the heat path to the heat sink. For example, in one embodiment, the contact length can be substantially larger than the thickness of the sidewall. As such, essentially all the heat flux will be redirected to the heat sink.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A plasma processing system, comprising:
a vacuum chamber defining a sidewall;
an inductive coil disposed adjacent the sidewall configured to induce a plasma in the vacuum chamber;
a Faraday shield disposed between the inductive coil and the sidewall;
a vacuum seal coupling the sidewall of the vacuum chamber to a heat sink, the heat sink comprising the Faraday shield; and
a thermally conductive bridge coupled between the sidewall and the Faraday shield;
wherein the thermally conductive bridge is positioned relative to the vacuum seal such that the thermally conductive bridge redirects a conductive heat path from a heat source to the Faraday shield so that the heat path bypasses the vacuum seal.

2. The plasma processing system of claim 1, wherein the bridge is flexible and conformable to the shape of the vacuum seal and vacuum chamber.

3. The plasma processing system of claim 2, wherein the bridge is elastic so that a contact to the heat source and to the Faraday shield can be made by compressing the bridge in at least one direction.

4. The plasma processing system of claim 3, wherein the bridge comprises a first component for making contact with the heat source and a second component for making contact with the Faraday shield.

5. The plasma processing system of claim 1, wherein the bridge comprises a heat conducting component and elastic component coupled to the heat conducting component.

6. The plasma processing system of claim 1, wherein the heat path conducts through at least a portion of the sidewall.

7. The plasma processing system of claim 1, wherein the thermally conductive bridge is positioned so that the heat path bypasses a portion of the sidewall abutting the vacuum seal.

8. The plasma processing system of claim 1, where the sidewall is mechanically connected to the top cap of the vacuum chamber by the vacuum seal and the bridge.

9. The plasma processing system of claim 1, wherein the heat sink comprises a top cap of the plasma chamber.

10. The plasma processing system of claim 1, wherein the heat sink comprises a top plate of a plasma processing chamber in communication with the vacuum chamber.

11. The plasma processing system of claim 1, wherein the sidewall comprises a quartz material.

12. The plasma processing system of claim 1, wherein the plasma processing system comprises a plasma screen proximate to the vacuum seal.

13. The plasma processing system of claim 1, wherein the bridge is located between the inductive coil and the vacuum seal.

14. The plasma processing system of claim 1, wherein the bridge is separated from the vacuum seal by a washer.

15. The plasma processing system of claim 1, wherein the bridge comprises a heat conducting component and a flexible component coupled to the heat conducting component.

16. The plasma processing system of claim 1, wherein the bridge comprises a spring loaded C-clamp.

17. The plasma processing system of claim 16, wherein the spring loaded C-clamp has a plurality of cuts.

* * * * *